(12) United States Patent
Singh et al.

(10) Patent No.: US 7,838,999 B1
(45) Date of Patent: Nov. 23, 2010

(54) SYSTEM AND METHOD OF MANUFACTURE FOR INTERCONNECTING AN INTEGRATED CIRCUIT AND A SUBSTRATE

(75) Inventors: Inderjit Singh, Saratoga, CA (US); Ray Chen, Fremont, CA (US); Behdad Jafari, Saratoga, CA (US)

(73) Assignee: NVIDIA Corporation, Santa Clara, CA (US)

( * ) Notice: Subject to any disclaimer, the term of this patent is extended or adjusted under 35 U.S.C. 154(b) by 580 days.

(21) Appl. No.: 11/733,149

(22) Filed: Apr. 9, 2007

(51) Int. Cl.
*H01L 29/40* (2006.01)

(52) U.S. Cl. ........................ 257/779; 257/784; 257/781; 257/780; 257/772; 257/E21.575; 257/E21.597; 257/E21.627; 257/E21.641; 438/745; 438/687

(58) Field of Classification Search ................. 257/773, 257/779, 784, 781, 780, 772, E21.575, E21.597, 257/E21.627, E21.641; 438/745, 687
See application file for complete search history.

(56) References Cited

U.S. PATENT DOCUMENTS

| | | | | |
|---|---|---|---|---|
| 6,415,974 | B2 * | 7/2002 | Jao | 228/215 |
| 6,819,000 | B2 * | 11/2004 | Magerlein et al. | 257/777 |
| 7,239,025 | B2 * | 7/2007 | Farrar | 257/779 |
| 2004/0159944 | A1 * | 8/2004 | Datta et al. | 257/737 |

* cited by examiner

*Primary Examiner*—Wael M Fahmy
*Assistant Examiner*—Marc Armand
(74) *Attorney, Agent, or Firm*—Zilka-Kotab, PC

(57) ABSTRACT

An integrated circuit/substrate interconnect apparatus and method of manufacture are provided. Included is a substrate with a plurality of wells and a landing pad formed in each of the wells. The substrate further includes a seed layer deposited in each of the wells over the landing pad, and a metalized layer deposited in each of the wells over the seed layer. Before assembly, an upper surface of the metalized layer forms a well.

22 Claims, 10 Drawing Sheets

SYSTEM AND METHOD OF MANUFACTURE FOR INTERCONNECTING AN INTEGRATED CIRCUIT AND A SUBSTRATE

FIELD OF THE INVENTION

The present invention relates to packaging integrated circuits, and more particularly to carrier substrates to which integrated circuits are interconnected for packaging purposes.

BACKGROUND

FIG. 1 illustrates a prior art assembly 100 including an integrated circuit 102 (illustrated as a "flip chip") adapted for physical and electrical attachment to a earner substrate 110 by way of a plurality of solder interconnects 106. While the integrated circuit 102 and the carrier substrate 110 are shown to be separated in FIG. 1, the interconnects 106 are adapted for providing connectivity between bond pads 104 of the integrated circuit 102 and copper landing pads 112 of the carrier substrate 110, when assembled.

To improve connectivity with respect to the copper landing pads 112 of the carrier substrate 110, various prior art systems include lead-tin (Ph/Sn) "pre-solder" material 108 that is printed within solder wells 114 of the carrier substrate 110 over the corresponding copper landing pads 112, in the manner shown. Thus, during assembly, the interconnects 106 and such solder material 108 may be subjected to a high temperature reflow process that facilitates a connection between the interconnects 106 and the solder material 108 and underlying landing pad 112. With assemblies being manufactured with smaller and smaller geometries (and thus smaller landing pads 112, wells 114, etc.), however, it has become increasingly difficult to fill such smaller wells 114 with the printed solder material 108, etc.

FIG. 2 illustrates another prior art assembly 200 again including an integrated circuit 202 and a carrier substrate 210, where interconnects 206 are adapted for providing improved connectivity between bond pads 204 of the integrated circuit 202 and copper landing pads 212 of the carrier substrate 210, when assembled. Unlike the prior art assembly 100 of FIG. 1, the assembly 200 substitutes the solder material 108 with a plated copper material 208 and an underlying copper seed layer 214 to facilitate conductivity. By using such plating technique (instead of the aforementioned printing technique), the copper material 208 is capable of better accommodating tighter geometries. Still yet, an immersion tin layer 216 is employed to prevent a surface of the plated copper material 208 from oxidizing, etc.

Thus, such plated copper material 208 and copper seed layer 214 provides enhanced electrical and mechanical connectivity between the interconnects 206 and the underlying landing pad 212, particularly for flip chip assemblies with smaller geometries. However, such plated copper material 208 significantly adds to the expense and thus a cost of the resultant assembly 200.

There is thus a need for addressing these and/or other issues associated with the prior art.

SUMMARY

An integrated circuit/substrate interconnect apparatus and method of manufacture are provided. Included is a substrate with a plurality of wells and a landing pad formed in each of the wells. The substrate further includes a seed layer deposited in each of the wells over the landing pad, and a metalized layer deposited in each of the wells over the seed layer. Before assembly, an upper surface of the metalized layer forms a well.

In different optional embodiments, the metalized layer may serve to increase a surface area that is capable of interfacing an interconnect connected between a bond pad of an integrated circuit and the landing, pad of the substrate, thus allowing for smaller landing pads, etc. Further, this may be accomplished while avoiding use of expensive plated copper material (in embodiments where the metalized layer is directly deposited over the seed layer), thus reducing a cost of the resultant assembly.

DETAILED DESCRIPTION

Figure 3:
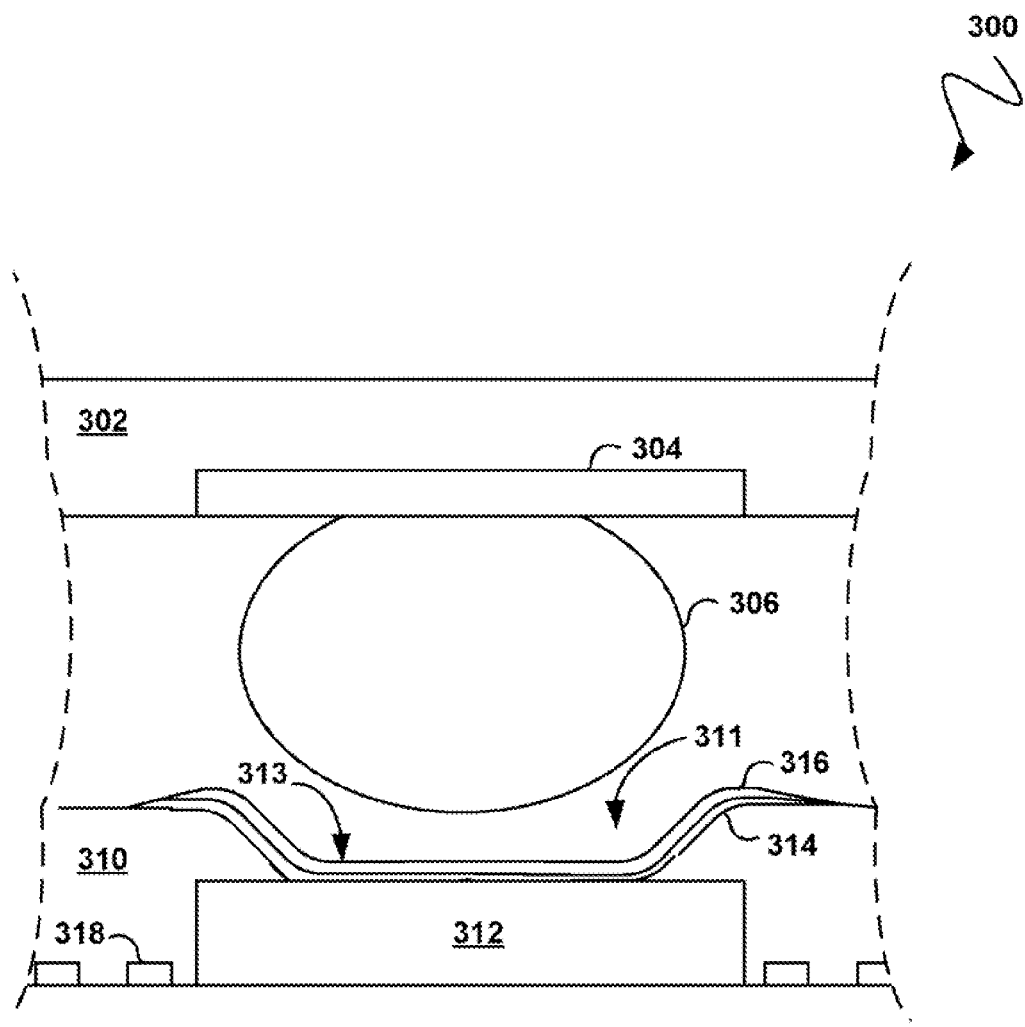
FIG. 3 shows an assembly for interconnecting a substrate and an integrated circuit, in accordance with one embodiment.

FIG. 3 shows an assembly 300 for interconnecting a substrate 310 and an integrated circuit 302, in accordance with one embodiment. It should be noted that the assembly 300 is not necessarily drawn to scale. Similar note should be taken with respect to the other figures as well.

In various embodiments, the illustrated integrated circuit 302 may take the form of a processor [e.g. a central processing unit (CPU), etc.], a graphics processor, one or more chips in a chipset (e.g. a group of integrated circuits designed to work and/or sold as a unit for performing related functions, etc.), etc. Of course, in the context of the present description, such integrated circuit 302 may refer to any circuit that is integrated utilized any desired processing (e.g. semiconductor processing, etc.).

As further shown, the integrated circuit 302 further includes a plurality of bond pads 304 (while only one bond pad is shown for purposes of clarity, many exist). Of course, such bond pads 304 may comprise of any desired material and serve to provide an interface with any circuitry, input/output (I/O) routing, etc of the integrated circuit 302.

For providing an electrical and mechanical coupling between the bond pads 304 of the integrated circuit 302 and the substrate 310, interconnects 306 (while only one interconnect, is shown for purposes of clarity, many exist) are provided. To accomplish this, interconnects 306 may include a solder material comprising any desired material that serves to provide the aforementioned electrical and/or mechanical connection.

By way of example only, such solder material of the interconnects 306 may include, but is not limited to lead, tin, indium, gallium, bismuth, cadmium, zinc, copper, gold, silver, antimony, and germanium. In still yet other embodiments, such solder material may comprise a silver/lead/tin alloy, an eutectic tin/silver alloy, a metal-filled polymer, a copper-filled epoxy, and/or any other material, for that matter. In even still additional embodiments, the solder material may be lead-free, as an option.

With continuing reference to FIG. 3, the substrate 310 includes a plurality of wells 311 (while only one well is shown for purposes of clarity, many exist), and a landing pad 312 formed in each of the wells 311. In various embodiments, the substrate 310 may include a multi-layer organic substrate, a built-up substrate, etc. In the context of the present description, however, the substrate 310 may include any entity to which the integrated circuit 302 may be attached.

Figure 5:
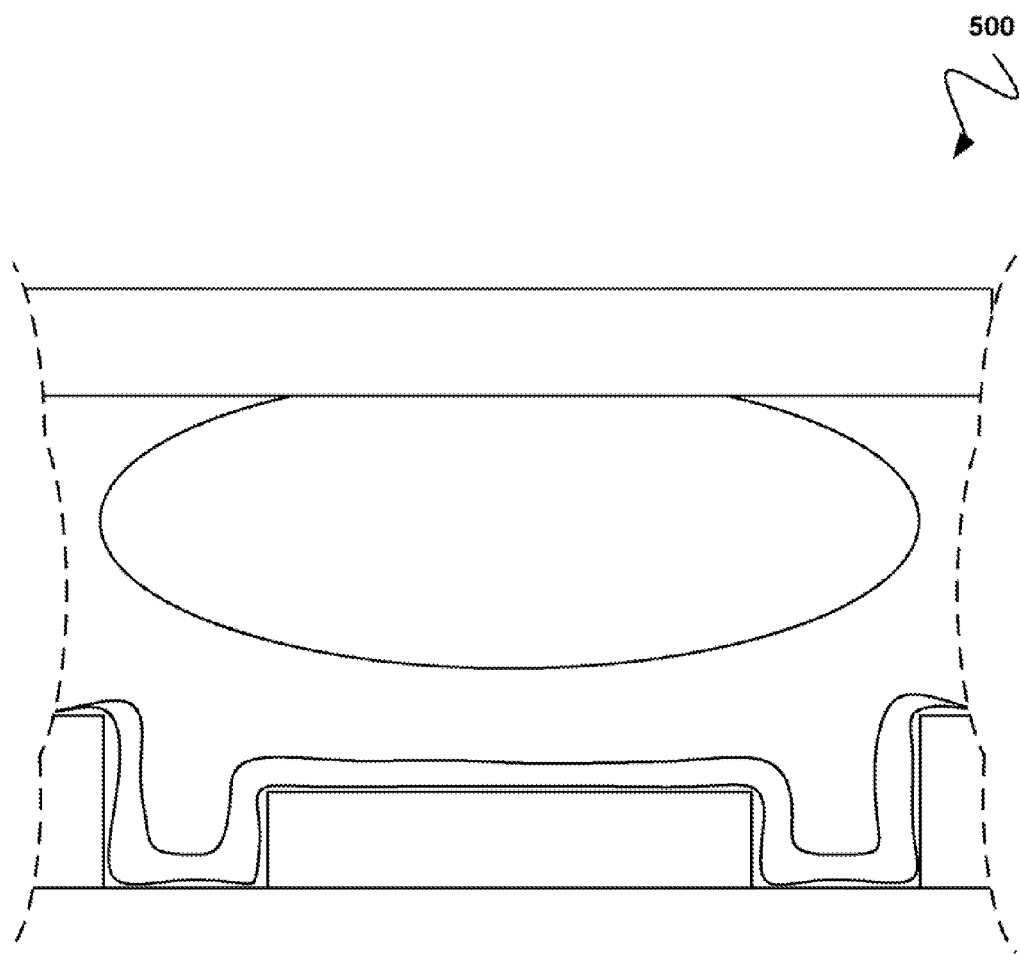
FIG. 5 shows an assembly manufactured utilizing a non solder mask defined (NSMD) technique, in accordance with one embodiment.

Similarly, while the landing pads 312 may take various specific forms [e.g. bare on lead (BOL)], etc.; it should be noted that such landing pads 312 may take any desired form for providing an interface with respect to the substrate 310. For example, in different embodiments, the landing pads 312 may be formed utilizing a solder mask defined (SMD) technique, in the manner shown. Of course, other embodiments are contemplated where a non solder mask defined (NSMD) technique is employed. See the assembly 500 of FIG. 5, for example. Still yet, the wells 311 may include any depression within which the landing pads 312 are formed. For example, the wells 311 may each include a sloped (as shown) or vertical interior wall, an upper edge of which defines a perimeter of the associated well 311.

The substrate 310 further includes a seed layer 314 deposited in each of the wells 311 over the landing pad 312. In one embodiment, the seed layer 314 may include copper e.g. electroless copper, etc.). Of course, however, other embodiments are contemplated where the seed layer 314 includes any other desired material that allows electrical communication between the associated landing pad 312 and any overlying layer(s).

Still yet, a metalized layer 316 is deposited in each of the wells 311 over the seed layer 314 (e.g. either directly over or with additional layers therebetween, etc.). In various embodiments, the metalized layer 316 may include, but is certainly not limited to plated and/or immersion tin, silver, tin-silver, nickel-gold, an organic solderability preservative (OSP), a eutectic, etc. In the context of the present description, however, the metalized layer 316 may include any desired material that allows electrical communication with the associated landing pad 312 via the seed layer 314, etc.

As shown, an upper surface 313 of the metalized layer 316 forms a well. In one embodiment, such metalized layer-defined well may follow any contours of the associated well 311 formed in the substrate 310. However, other embodiments are also contemplated where, depending on the manner in which the seed layer 314 and/or metalized layer 316 is deposited, such metalized layer-defined well may differ in degree and/or shape.

For reasons that will soon become apparent, the seed layer 314 and/or the metalized layer 316 may optionally extend up the interior wall of the well 314 and possibly even extend laterally outside a perimeter of the well 314. More information regarding one possible way in which the foregoing structure may be provided will be set forth during the description of FIGS. 6-7F. Of course, any desired method of manufacture may be employed which results in the desired structure.

Figure 4:
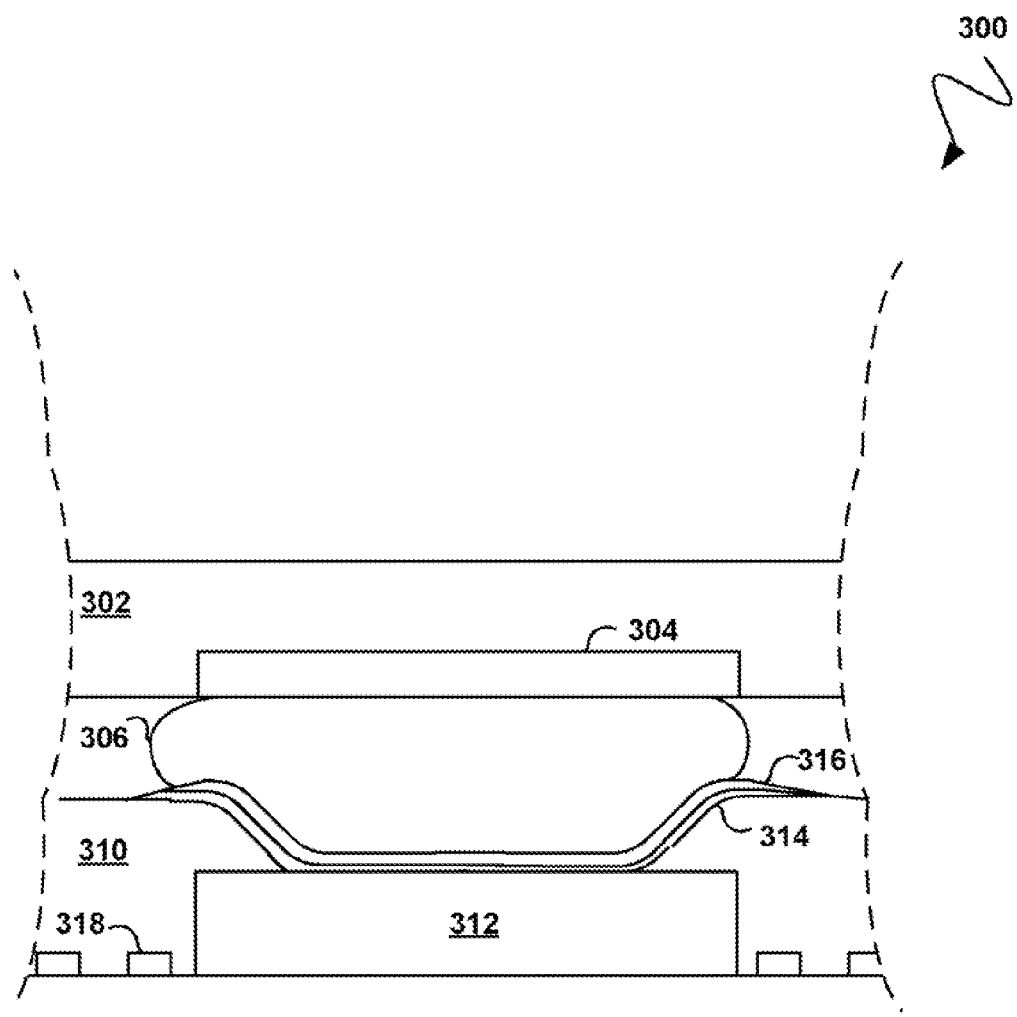
FIG. 4 shows the assembly of FIG. 3 with the substrate and integrated circuit interconnected, in accordance with one embodiment.

FIG. 4 shows the assembly 300 of FIG. 3 with the substrate 310 and integrated circuit 302 interconnected, in accordance with one embodiment. As shown, the interconnect 306 (when heated) conforms to the well defined by the upper surface of the metalized layer 316 and further couples with portions of the metalized layer 316 that extend beyond the perimeter of the associated well 311. Still yet, the metalized layer 316 may also be solderable (when heated) to further enhance connectivity with respect to the interconnect 306.

To this end, the metalized layer 316 may serve to increase a surface area that is capable of interfacing the interconnect 306. Further, in some embodiments, dimensions of the landing pads 312 may be reduced since use of any "pre-solder" material may be avoided, thereby providing more room for routing circuitry 318 situated therebetween. Still yet, these features may be provided while avoiding use of any expensive copper plated material, thus possibly reducing a cost of the resultant assembly 300.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 6:
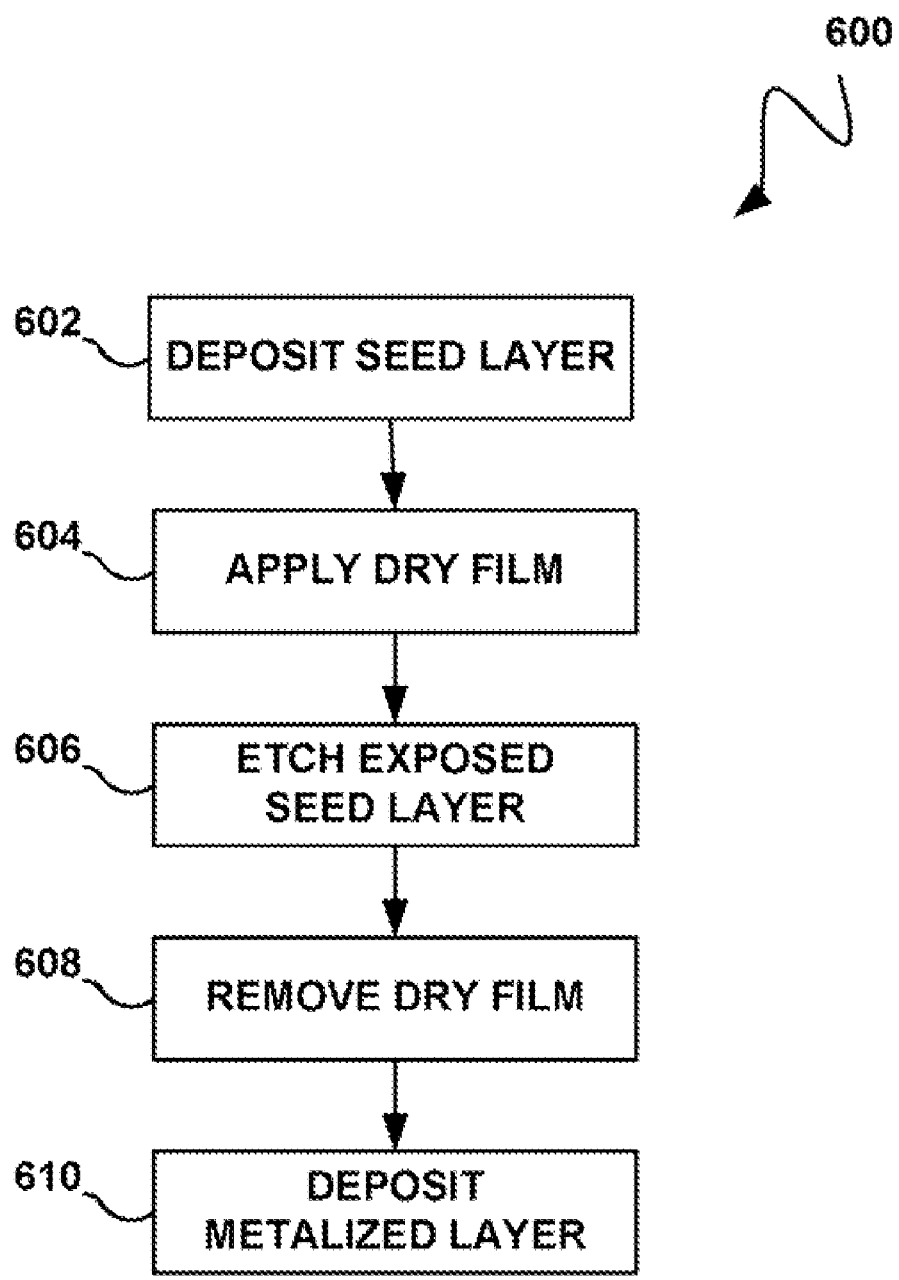
FIG. 6 shows a method for manufacturing a substrate, in accordance with one embodiment.
Figure 7A:
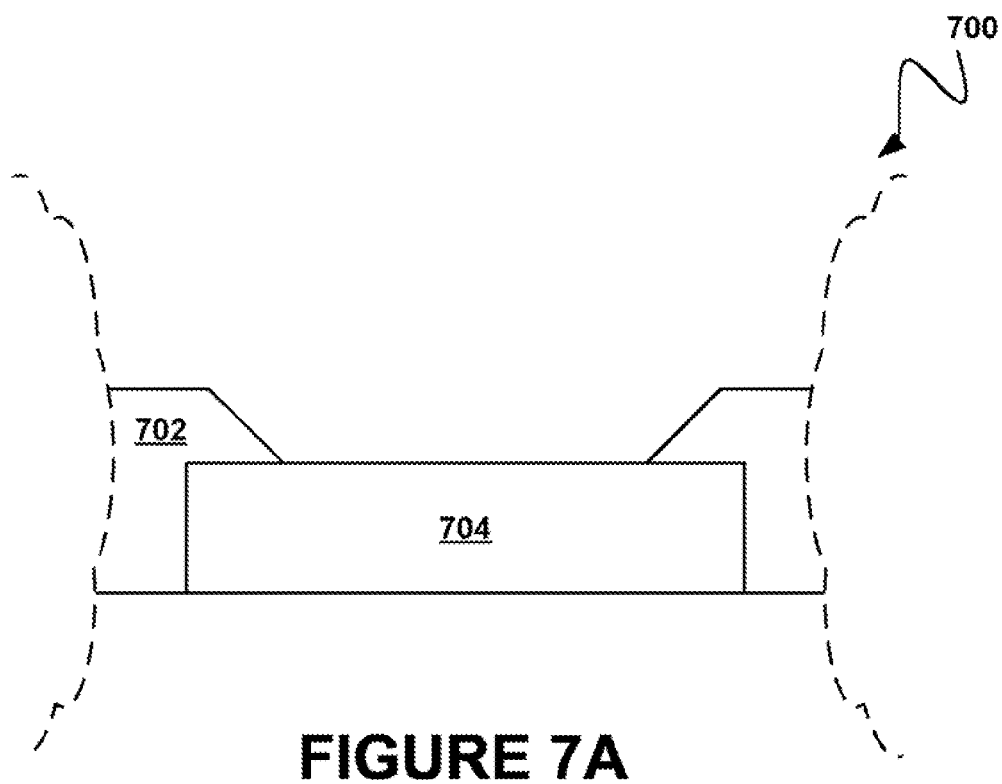
FIGS. 7A-7F illustrate a substrate at various stages of the method of FIG. 6, in accordance with one exemplary embodiment.
Figure 7B:
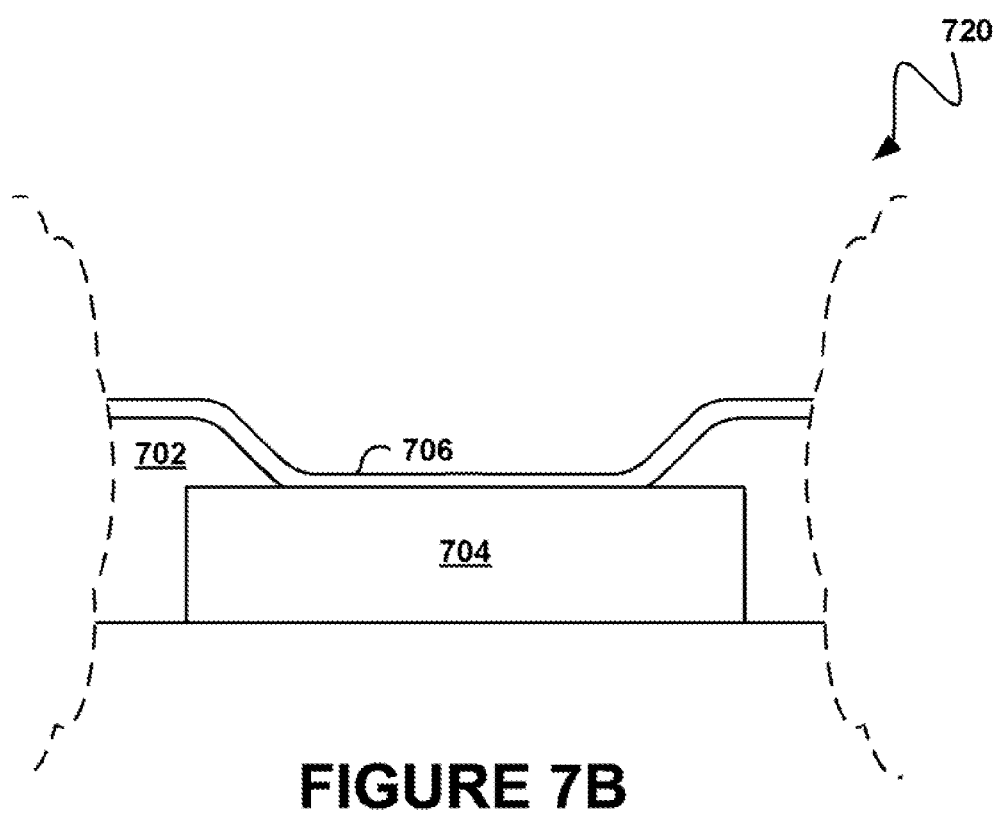
Figure 7C:
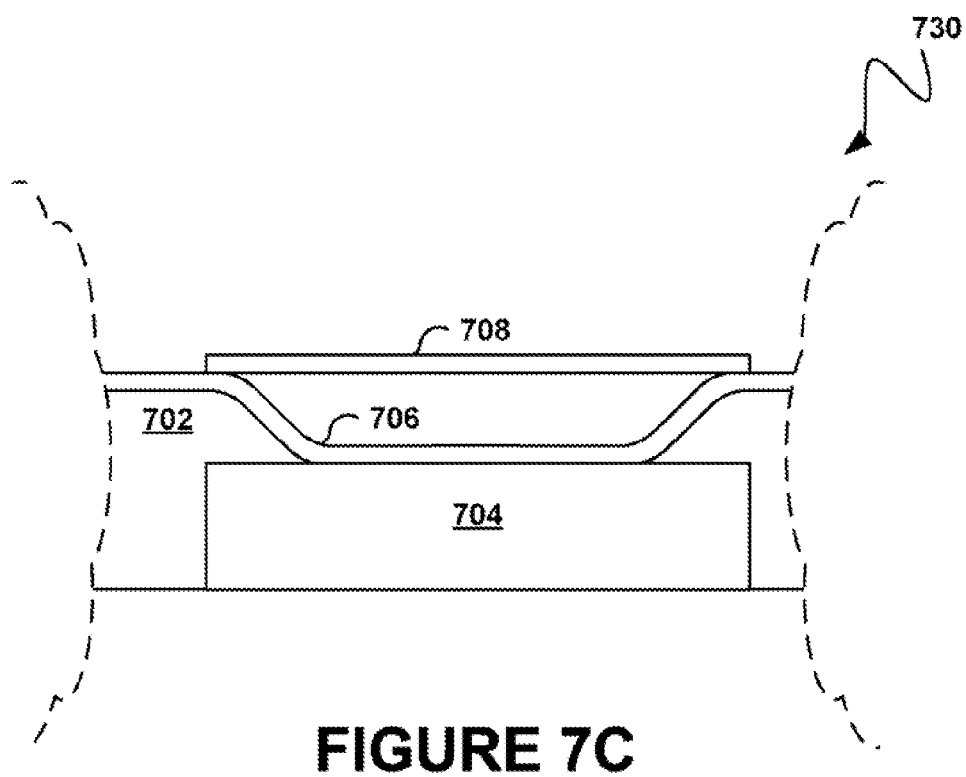
Figure 7D:
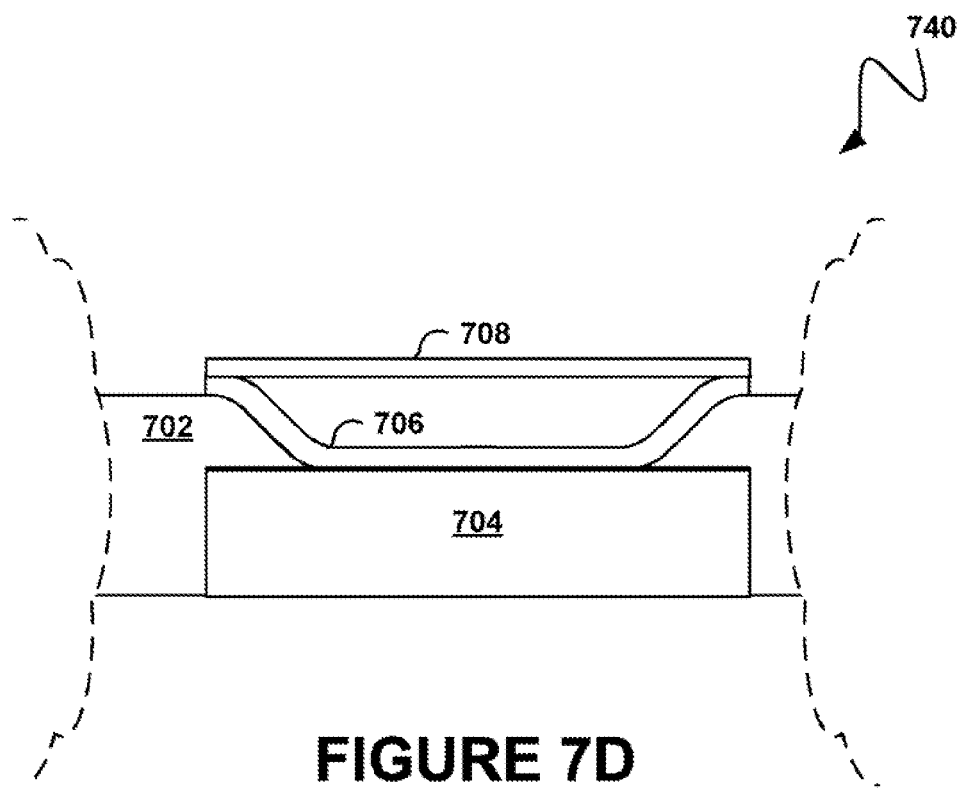
Figure 7E:
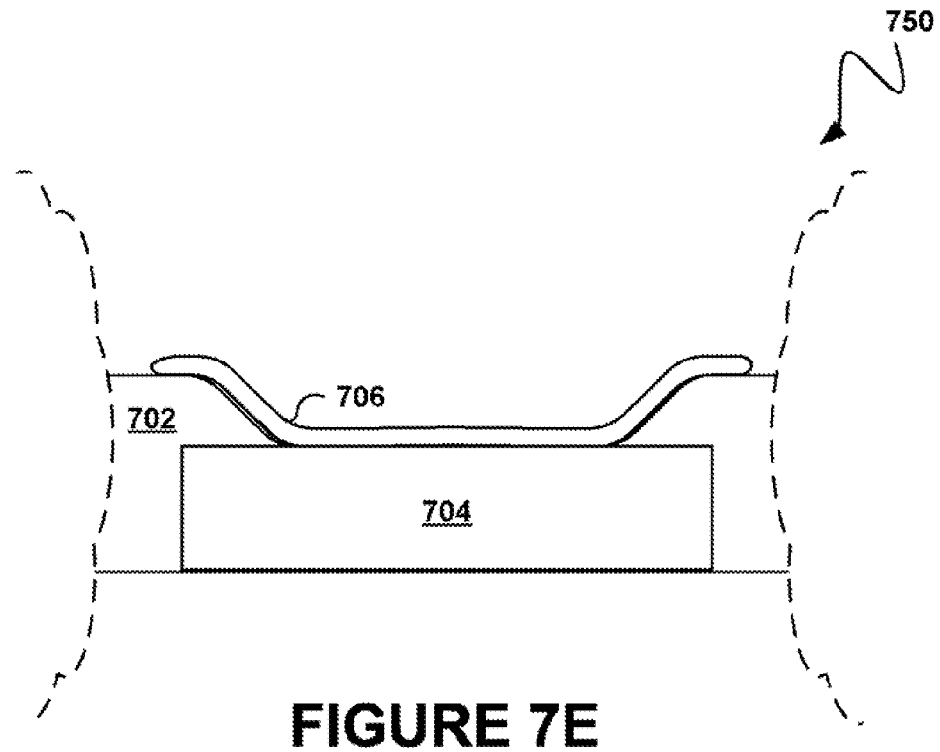
Figure 7F:
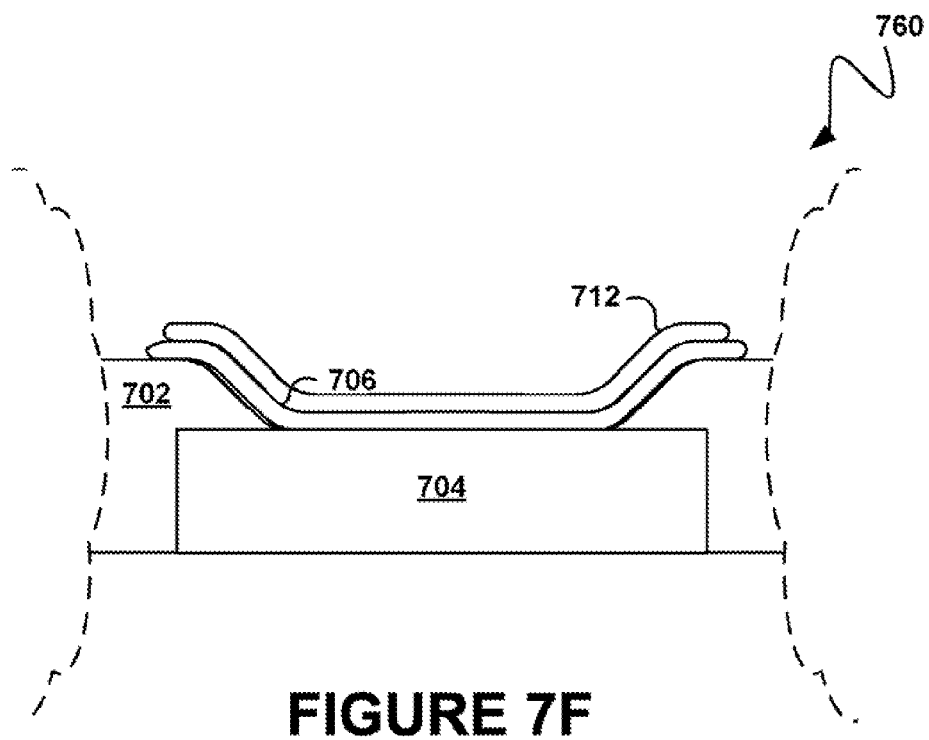

FIG. 6 shows a method 600 for manufacturing a substrate, in accordance with one embodiment. As an option, the present method 600 may be implemented to produce the substrates of FIGS. 3-5. Of course, however, the method 600 may be used in any desired context. For clarity purposes, the method 600 will be described below with reference to FIGS. 7A-7F, which illustrate the substrate at each operation of the method 600 of FIG. 6.

In one embodiment, the method 600 may be applied to a substrate including a plurality of wells each with a corresponding landing pad. See, for example, the substrate 702 with a well and a corresponding landing pad 704 formed therein in FIG. 7A.

As shown, a seed layer may be deposited in each of the wells over the landing pad. See operation 602. In one embodiment, such seed layer may include copper (or any other conductive material) that is sputtered and/or plated onto the entire upper surface of the substrate, thus lining the base and interior walls of the wells as well as covering the remaining substrate surface. In one possible embodiment, such seed layer may have a thickness of between 1-2 um or any desired thickness, for that matter. See, for example, the substrate 702 with a seed layer 706 formed thereon in FIG. 7B.

With continuing reference to FIG. 6, a film is patterned and applied to the substrate so as to cover the wells. Note operation 604. In various embodiments, a dry or liquid film with a thickness of 1-2 um (or any other thickness) may be utilized. For reasons that will soon become apparent, such film may be applied to a surrounding area about a perimeter of each well. In one embodiment, this may be accomplished utilizing a photolithography technique or the like. See, for example, the seed layer 706 with a film 708 applied thereon in FIG. 7C.

To this end, an exposed portion of the seed layer may be etched, as indicated in operation 606. A dry etching process or any other technique (e.g. a liquid-based process, etc.) may be employed for such purpose. See, for example, the seed layer 706 after etching in FIG. 7D.

Thereafter, the film may be removed in operation 608 leaving, as exposed, the remaining portion of the seed layer. As mentioned earlier, the film may be applied so as to extend beyond a perimeter of each well. By this feature, when the film is removed, a periphery of the seed layer extends beyond the perimeter of the associated well. In one embodiment, the periphery of the seed layer may extend beyond the well perimeter in the order of 20-30 um (or more/less in other embodiments). See, for example, the seed layer 706 without the film 708 in FIG. 7E.

In operation 610, a metalized layer is then patterned and deposited only over the seed layer. As mentioned earlier, such metalized layer may include any material that provides conductivity to the landing pad via the seed layer. In one possible embodiment, the metalized layer may have a thickness of between 2-6 um or any desired thickness, for that matter. In various embodiments, electroless or electro-plating (or any other desired technique) may be employed to deposit the metalized layer. See, for example, the metalized layer 712 deposited over the seed layer 706 in FIG. 7F. While the metalized layer 712 is shown to directly contact the seed layer 706 in FIG. 7F, it should be noted that other embodiments are contemplated with intermediate layers therebetween.

Figure 1:
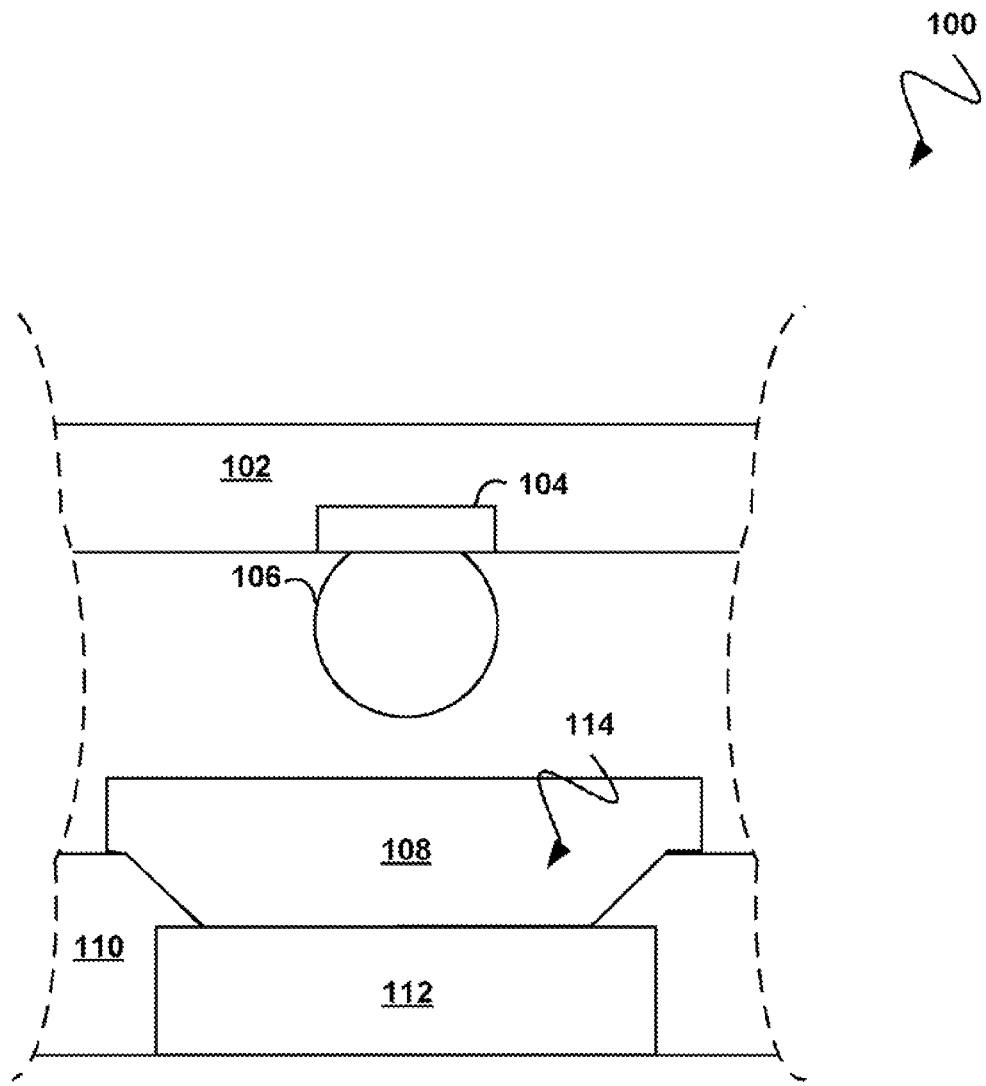
FIG. 1 illustrates a prior art assembly including an integrated circuit (illustrated as a "flip chip") adapted for physical and electrical attachment to a carrier substrate by way of a plurality of solder interconnects.
Figure 2:
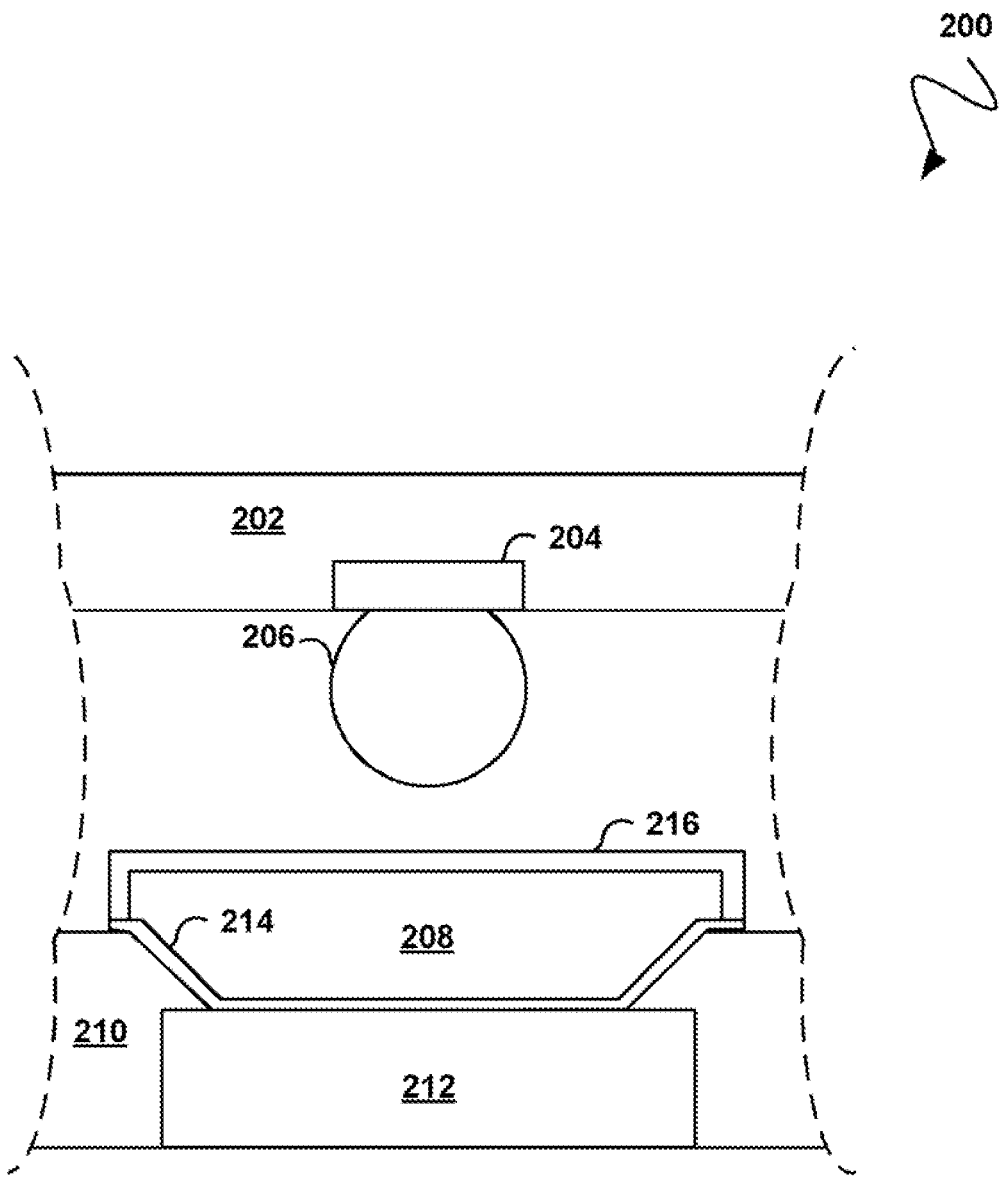
FIG. 2 illustrates another prior art assembly that incorporates a plated copper material.

In one embodiment, the use of plating techniques to deposit the metalized layer may also better serve to fill an under cut area of the solder mask (e.g. for enhanced reliability, etc.). A problem sometime exists where the under cut area of the solder mask may not necessarily be completely filled when using conventional techniques. See FIGS. 1 and 2, for example. If such under cut area is not completely filled, the resultant design may be more susceptible to cracking, etc due to the fact that such area is often subject to high stress conditions, etc.

Thus, the fact that the metalized layer extends beyond the associated well perimeter may serve to increase a surface area that is capable of interfacing an interconnect (not shown). Also contributing to such increase in surface area is the fact that an upper surface of the metalized layer extends in the depth direction along the well interior wall (as well as laterally), thus affording even more interconnect interface area.

Still yet, the metalized layer may change to a more liquid state (when subjected to heat) similar to the solder material of the interconnect, thus further strengthening the resultant coupling. Still yet, this may be accomplished while avoiding use of any expensive copper plated material, thus possibly reducing, a cost of the resultant assembly. In particular, a pre-solder on pad (SOP) process typically required for solder connection and protection from oxidation on the substrate may be avoided.

As yet another option, dimensions of the landing pads may thereby be reduced for providing more room for routing circuitry and thus higher routing density. For example, embodiments are contemplated where a bump pitch may be less than 150 um, 140 um, 130 um, and even less than 100 um, etc.

In one embodiment, the integrated circuits and the substrates disclosed herein may take the form of a flip chip. Of course, varying embodiments are also contemplated which may involve ceramic packaging, plastic grid arrays, ball grid arrays, etc.

Figure 8:
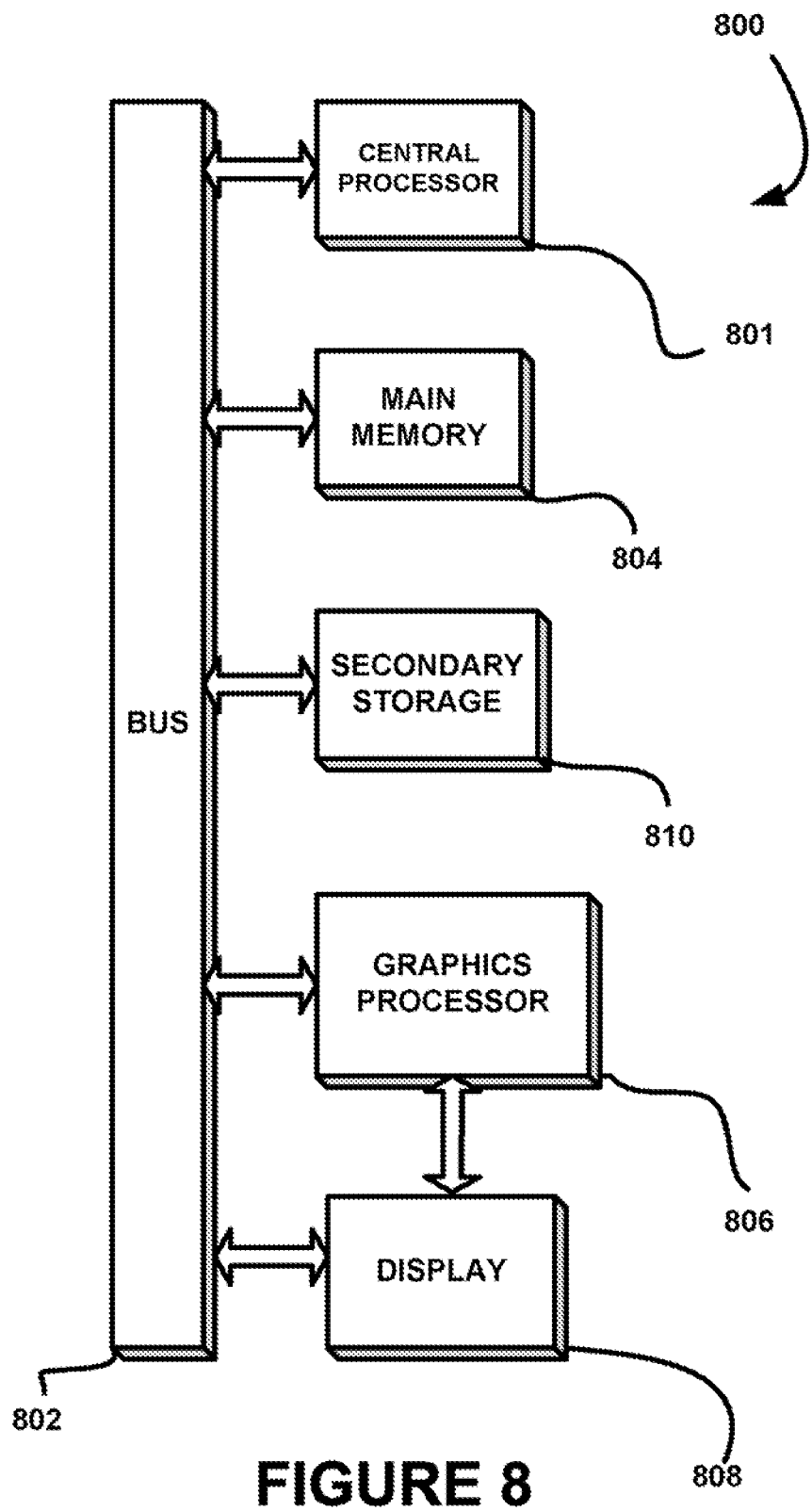
FIG. 8 illustrates an exemplary computer system in which the assemblies of the various previous embodiments may be implemented.

FIG. 8 illustrates an exemplary computer system 800 in which the assemblies of the various previous embodiments may be implemented. As shown, a computer system 800 is provided including at least one host processor 801 which is connected to a communication bus 802. The computer system 800 also includes a main memory 804. Control logic (software) and data are stored in the main memory 804 which may take the form of random access memory (RAM).

The computer system 800 also includes a graphics processor 806 and a display 808, i.e. a computer monitor. In one embodiment, the graphics processor 806 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The computer system 800 may also include a secondary storage 810. The secondary storage 810 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 804 and/or the secondary storage 810. Such computer programs, when executed, enable the computer system 800 to perform various functions. Memory 804, storage 810 and/or any other storage are possible examples of computer-readable media.

In one embodiment, the assemblies of the various previous figures may be implemented in the context of the host processor 801, graphics processor 806, an integrated circuit (not shown) that is capable of at least a portion of the capabilities of both the host processor 801 and the graphics processor 806, a chipset (i.e. a group of integrated circuits designed to work and sold as a unit for performing related functions, etc), main memory 804, and/or any other integrated circuit for that matter.

Still yet, the architecture and/or functionality of the various previous figures may be implemented in the context of a general computer system, a circuit hoard system, a game console system dedicated for entertainment purposes, an application-specific system, and/or any other desired system.

While various embodiments have been described above, it should be understood that they have been presented by way of example only, and not limitation. For example, any of the network elements may employ any of the desired functionality set forth hereinabove. Thus, the breadth and scope of a preferred embodiment should not be limited by any of the above-described exemplary embodiments, but should be defined only in accordance with the following claims and their equivalents.

What is claimed is:

1. A substrate, comprising:
   a plurality of wells;
   a landing pad formed in each of the wells;
   a seed layer deposited in each of the wells directly over the landing pad and a substrate; and
   a metalized layer deposited in each of the wells directly over the seed layer;
   wherein an upper surface of the metalized layer forms a well;
   wherein an interconnect conforms to the well formed by the upper surface of the metalized layer.

2. The substrate of claim 1, wherein the seed layer comprises copper.

3. The substrate of claim 1, wherein the metalized layer comprises a material including one of tin, silver, nickel, gold, an organic solderability preservative (OSP), and a eutectic.

4. The substrate of claim 1, wherein the metalized layer comprises tin.

5. The substrate of claim 1, wherein the landing pad is formed utilizing a non solder mask defined (NSMD) technique.

6. The substrate of claim 1, wherein the landing pad is formed utilizing a solder mask defined (SMD) technique.

7. The substrate of claim 1, wherein the seed layer and the metalized layer extend up an interior wall of the corresponding well.

8. The substrate of claim 1, wherein the seed layer and the metalized layer extend laterally outside a perimeter of the corresponding well.

9. The substrate of claim 1, wherein the seed layer is deposited directly over the landing pad for allowing electrical communication between the landing pad and the metalized layer.

10. The substrate of claim 1, wherein the well formed by the upper surface of the metalized layer differs in degree and shape from an associated well.

11. The substrate of claim 1, wherein an upper surface of the landing pad is higher than a lower surface of an associated well.

12. The substrate of claim 1, wherein only a bottom surface of the landing pad is in contact with the substrate.

13. A method, comprising:
   providing a substrate including a plurality of wells each with a corresponding landing pad;
   depositing a seed layer in each of the wells directly over the landing pad and the substrate; and
   depositing a metalized layer in each of the wells directly over the seed layer such that an upper surface of the metalized layer forms a well;
   wherein an interconnect conforms to the well formed by the upper surface of the metalized layer.

14. The method of claim 13, wherein the seed layer and the metalized layer extend up an interior wall of the corresponding well.

15. The method of claim 13, wherein the seed layer and the metalized layer extend laterally outside a perimeter of the corresponding well.

16. The method of claim 13, and further comprising interconnecting an integrated circuit with the substrate.

17. The method of claim 16, wherein a plurality of interconnects are connected between a plurality of bond pads of the integrated circuit and the landing pads of the substrate.

18. The method of claim 13, wherein the metalized layer is deposited utilizing a plating technique for filling an undercut area.

19. A system, comprising
   a packaged apparatus including:
      an integrated circuit including a plurality of bond pads;
      a substrate including a plurality of wells, a landing pad formed in each of the wells, a seed layer deposited in each of the wells directly over the landing pad and the substrate, and a metalized layer deposited in each of the wells directly over the seed layer, where an upper surface of the metalized layer forms a well; and
      a plurality of interconnects connected between the bond pads of the integrated circuit and the landing pads of the substrate;
   wherein an interconnect conforms to the well formed by the upper surface of the metalized layer.

20. The system of claim 19, wherein the interconnects are lead-free.

21. The system of claim 19, wherein the packaged apparatus includes a processor.

22. The system of claim 19, wherein the processor is coupled to memory via a bus.

* * * * *